United States Patent
Nishimura et al.

(10) Patent No.: US 10,490,772 B2
(45) Date of Patent: Nov. 26, 2019

(54) DISPLAY DEVICE

(71) Applicant: Japan Display Inc., Minato-ku (JP)

(72) Inventors: Masumi Nishimura, Minato-ku (JP); Heisuke Kanaya, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 16 days.

(21) Appl. No.: 15/728,707

(22) Filed: Oct. 10, 2017

(65) Prior Publication Data
US 2018/0108864 A1 Apr. 19, 2018

(30) Foreign Application Priority Data
Oct. 17, 2016 (JP) ................... 2016-203583

(51) Int. Cl.
*H01L 51/52* (2006.01)
*H01L 27/32* (2006.01)
*H01L 51/00* (2006.01)
*H01L 27/12* (2006.01)
*H01L 29/423* (2006.01)
*H01L 29/786* (2006.01)

(52) U.S. Cl.
CPC ...... *H01L 51/5253* (2013.01); *H01L 27/1218* (2013.01); *H01L 27/1248* (2013.01); *H01L 27/3246* (2013.01); *H01L 27/3262* (2013.01); *H01L 51/0097* (2013.01); *H01L 51/5225* (2013.01); *H01L 27/1222* (2013.01); *H01L 27/1274* (2013.01); *H01L 29/42384* (2013.01); *H01L 29/78675* (2013.01); *H01L 2029/42388* (2013.01); *H01L 2227/326* (2013.01); *H01L 2251/5338* (2013.01); *H01L 2251/558* (2013.01)

(58) Field of Classification Search
None
See application file for complete search history.

(56) References Cited

U.S. PATENT DOCUMENTS

| | | | |
|---|---|---|---|
| 2010/0213827 A1 | 8/2010 | Yoshida et al. | |
| 2012/0250138 A1* | 10/2012 | Yasui | G02F 1/167 359/296 |
| 2014/0117336 A1* | 5/2014 | Kim | H01L 51/5246 257/40 |
| 2017/0025636 A1* | 1/2017 | Hagihara | H01L 51/5246 |

FOREIGN PATENT DOCUMENTS

| JP | 2010-73700 | 4/2010 |
|---|---|---|
| JP | 2011-44271 | 3/2011 |

* cited by examiner

*Primary Examiner* — Jay C Chang
(74) *Attorney, Agent, or Firm* — Oblon, McClelland, Maier & Neustadt, L.L.P.

(57) ABSTRACT

The purpose of the present invention is to realize a reliable bendable organic EL display device with high reliability. The structure of the invention is as follows. An organic EL display device comprising: pixels, each of the pixels has an emitting layer, which is sandwiched by a lower electrode and an upper electrode, a first inorganic protective film is formed on the emitting layer, the first inorganic protective film is circle or polygon having at least five sides, in a plan view.

16 Claims, 9 Drawing Sheets

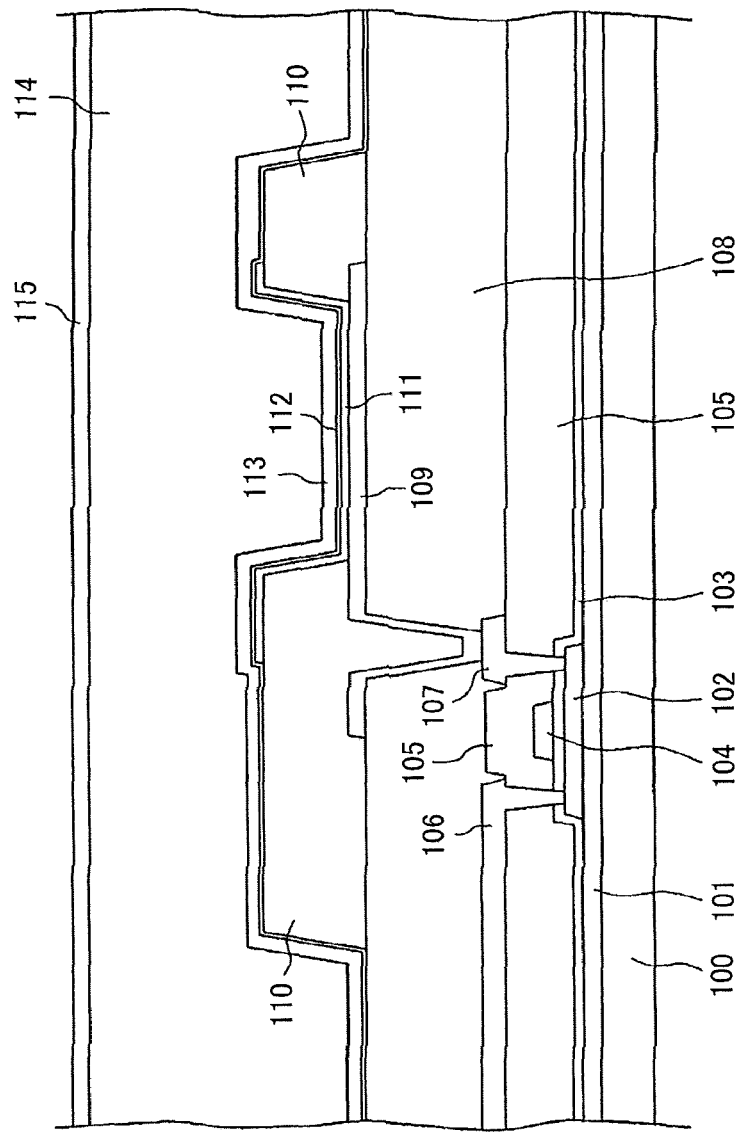

DISPLAY DEVICE

CLAIM OF PRIORITY

The present application claims priority from Japanese Patent Application JP 2016-203583 filed on Oct. 17, 2016, the content of which is hereby incorporated by reference into this application.

BACKGROUND OF THE INVENTION

(1) Field of the Invention

The present invention relates to a flexible display device that the substrate is bendable.

(2) Description of the Related Art

An organic EL display device and a liquid crystal display device can be flexibly bent by making those displays thin. An organic EL display device can be more flexible than a liquid crystal display device because an organic EL display device doesn't need a backlight.

Patent document 1 (Japanese patent laid open 2011-44271) discloses the organic EL display device characterized in that: a flattening film is divided into individual pixels, and the divided pixels are coated by an electrode, thus, the organic EL layer is prevented from being contaminated by impurities contained in the substrate that is formed by organic substance.

Patent document 2 (Japanese patent laid open 2010-73700) discloses the organic EL display device that the organic EL layer is made by coating characterized in that: forming grooves in the bank, which partitions pixels, to prevent the liquid materials of the organic EL layer from going to other pixels.

SUMMARY OF THE INVENTION

An organic EL display device and a liquid crystal display device can be flexibly bent by making substrates by flexible organic substance. An organic EL display device can be more flexible than a liquid crystal display device because an organic EL display device doesn't need a backlight.

The organic EL display device has TFTs (Thin Film Transistors), various insulating films or protecting films on the substrate (herein after TFT substrate). Some of those are formed by inorganic substance like SiO or SiN. (SiOx is represented by SiO; SiNx is represented by SiN in the specification.) There is a chance that those inorganic substances are broken when the displays are bent since those inorganic films are hard. Many metal wirings, which are formed by thin films, are formed on the TFT substrate; those wirings tend to get disconnections when the display device is bent.

The purpose of the present invention is to prevent those inorganic insulating layer and inorganic protective layer from being broken or to prevent those wirings from getting disconnections when the display is bent; thus, to realize reliable flexible display devices.

A direction of bending of the display device is not always one direction. Even a display device is bendable, there is a direction that the display device is hard to bend, or a direction that the display device tend to be broken when it is bent. In addition, it is difficult to predict which directions the display is bent. Thus, another purpose of the present invention is to realize a display device that bending stresses are similar when the display is bent in any directions.

The present invention can solve the above problems; concrete measures are as follows:

An organic EL display device comprising: pixels, each of the pixels has an emitting layer, which is sandwiched by a lower electrode and an upper electrode, a first inorganic protective film is formed on the emitting layer, the first inorganic protective film is circle or polygon having at least five sides, in a plan view.

(2) An organic EL display device comprising: pixels, each of the pixels has an emitting layer, which is sandwiched by a lower electrode and an upper electrode, and a first TFT, which connects with the lower electrode, wherein the first TFT includes a first semiconductor layer, which is formed on an first undercoat formed on a substrate, a first gate insulating film and a first gate electrode, the first undercoat is formed in island shape at a position corresponding to the first TFT, the first undercoat is circle or polygon having at least five sides, in a plan view, the first gate insulating film, which is formed on the first undercoat, is formed in island shape, the first gate insulating film is circle or polygon having at least five sides, in a plan view.

BRIEF DESCRIPTION OF THE DRAWINGS

FIG. 10 is a cross sectional view of the organic El display device as a comparative example.

DETAILED DESCRIPTION OF THE PREFERRED EMBODIMENTS

Figure 1:
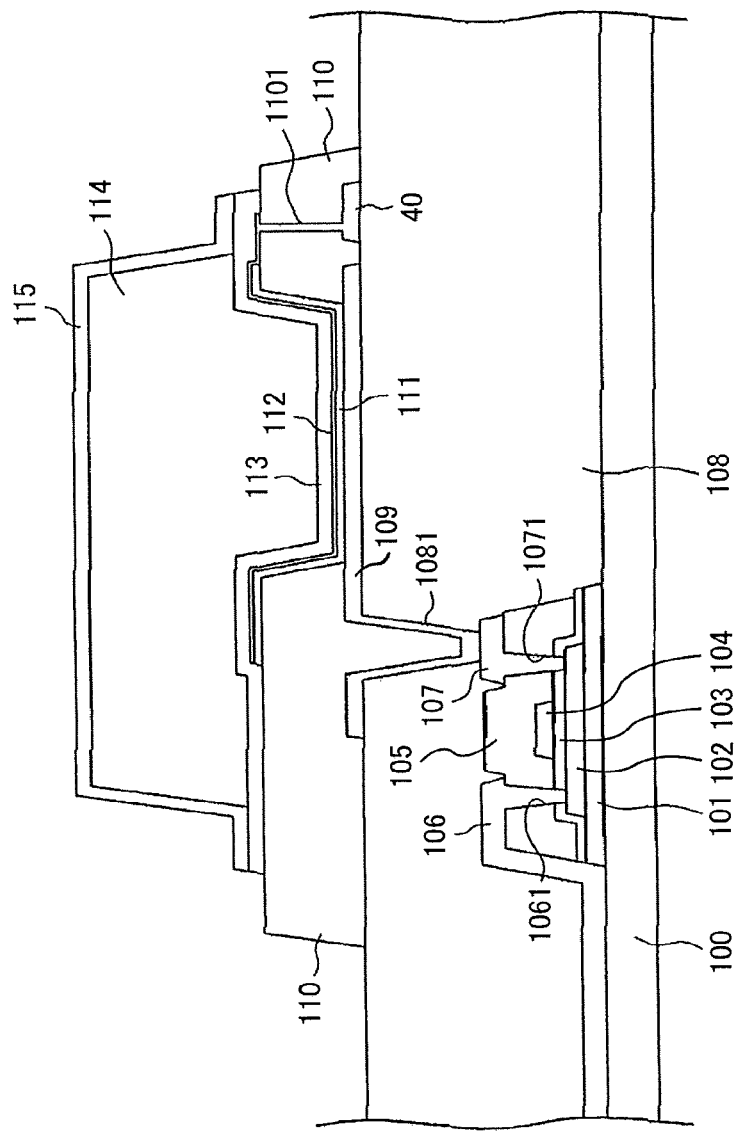
FIG. 1 is a cross sectional view according to the present invention.

Before explaining the structure of the present invention, a comparative example of the organic EL display device that doesn't use the present invention is explained. FIG. 10 is a cross sectional view of the organic EL display device as a comparative example. Since detailed structure will be explained in FIG. 1, only outlines of the structures are explained here. In FIG. 10, the undercoat 101 by SiO or SiN is formed on the TFT substrate that is formed by resin. The semiconductor layer 102, the gate insulating film 103, which covers the semiconductor layer 102, are formed on the undercoat 101.

The gate electrode 104 is formed on the gate insulating film 103; the interlayer insulating film 105 is formed by e.g. SiN on the gate electrode 104. The through holes are formed in the interlayer insulating film 106 and the gate insulating film 103 to connect the semiconductor layer 102 with the drain electrode 106 or the source electrode 107, which are formed by metal or alloy. The organic passivation film 108 is formed on the drain electrode 106 or the source electrode 107. The lower electrode 109 is formed on the organic passivation film 108; the lower electrode 109 works also as a reflecting electrode. The bank 110 is formed to cover the periphery of the lower electrode 109.

The organic EL layer 111 is formed in a hole of the bank 110; the upper electrode 112 is formed on the organic EL layer 111. The upper electrode, which is formed by an oxide conductor film, a metal film or an alloy film, is formed all over the display area. The protective layer is formed on the upper electrode 112. The protective layer comprises: a first inorganic protective film 113 formed by e.g. SiN, an organic protective film 114 formed e.g. by acrylic and a second inorganic protective film 115 formed by e.g. SiN.

In FIG. 10, the undercoat 101, the gate insulating film 103, the interlayer insulating film 105, the first protective film 113, the second protective film 115 are formed by e.g. SiO or SiN, which are hard and formed in a large area. Therefore, when the display is bent, those layers tend to be broken; consequently, they will not be able to work properly as an insulating layer or a protective layer.

In addition, the lower electrode 109 is formed by a laminated film of oxide conductor and metal. The upper electrode is formed by a thin film of metal or alloy, or by an oxide conductor. Further, the upper electrode 112 is formed on all over the display area. Therefore, the display, when it is used in bending condition, those electrodes tend to be broken.

As described above, the structure that doesn't use the present invention has a problem of reliability when it is bent. The present invention solves this problem. The preset invention is explained by the embodiments in detail.

First Embodiment

FIG. 1 is a cross sectional view of the organic EL display according to the present invention. FIG. 1 is a cross sectional view of the driving TFT (T1) and the organic EL element (EL) in the pixel, which is explained in FIG. 2. Herein after, if it is not specifically noted, the TFT means the driving TFT (T1). In FIG. 1, the TFT substrate 100 is formed by glass or resin. Glass, if the thickness is 0.2 mm or less, can be flexibly bent. On the other hand, if the TFT substrate is formed by resin, the display device becomes more flexible.

Polyimide is specifically suitable for the substrate because of its heat resistance and its mechanical strength. Since polyimide can be made as thin as 5-20 μm, a very thin display device can be realized. A manufacturing method of the TFT substrate 100 of polyimide is as follows:

At the outset, polyamic acid, which is material of the polyimide, is coated on the glass substrate, then the polyamic acid is imidized; consequently the TFT substrate 100 of approximately 10-20 μm in thickness is formed. After that, the TFTs, the organic passivation film, insulating layers, wirings, protective layers are formed on the TFT substrate 100. After that, a laser is irradiated at the interface of the glass substrate and the polyimide, then, the glass substrate is removed from the TFT substrate.

Back to FIG. 1, the undercoat 101 is formed on the TFT substrate 100. However, unlike a conventional structure, the undercoat is formed island like at a portion where the TFT is formed. The undercoat is formed by CVD on all over the TFT substrate, then, is patterned in island like by photo lithography. The function of the undercoat is to block the impurity from the glass substrate or the resin substrate; thus, to protect the semiconductor 102 of the TFT from being contaminated by the impurity.

The undercoat 101 is generally formed by a laminated film of a SiN film and a SiO film; both of SiN and SiO are hard materials. Thus, when the display device is bent, the undercoat 101 is destroyed. In this invention, however, the undercoat 101 is formed in a limited area where TFT is formed; thus, stress to the undercoat is limited in an extent that the undercoat 101 is not broken. Further, in the present invention, the plan view of the undercoat is made as circle, thus, the stress is uniform in all the bending directions. The circle in this specification means a disc shape, not a circle line.

The semiconductor layer 102 is formed on the undercoat 101. The semiconductor layer 102 is formed by the LTPS (Low Temperature Poly-Si). Namely, the a-Si is formed on all over the substrate by CVD, then, the a-Si is transformed to the Poly-Si by irradiating excimer laser on it. After that, the Poly-Si is patterned by photo lithography.

After that, the gate insulating film 103 is formed on the semiconductor layer 102. The gate insulating film 103 is SiO formed by CVD using TEOS (Tetraethyl orthosilicate) as material. The gate insulating film is also formed on all over the substrate first, then, it is patterned by photo lithography. In addition, in the present invention, the plan view of the gate insulating film 103 is made as circle, thus, the stress is uniform in all the bending directions.

The gate electrode 104 is formed by a metal or an alloy on the gate insulating film 103. The Metals used for the gate electrode 104 are Mo, W, Ti or alloys of those metals. The TFT in FIG. 1 is the driving TFT (T1), which is explained in FIG. 2; the gate electrode of the driving TFT (T1) connects with the source electrode of the selecting TFT (T2).

Figure 3:
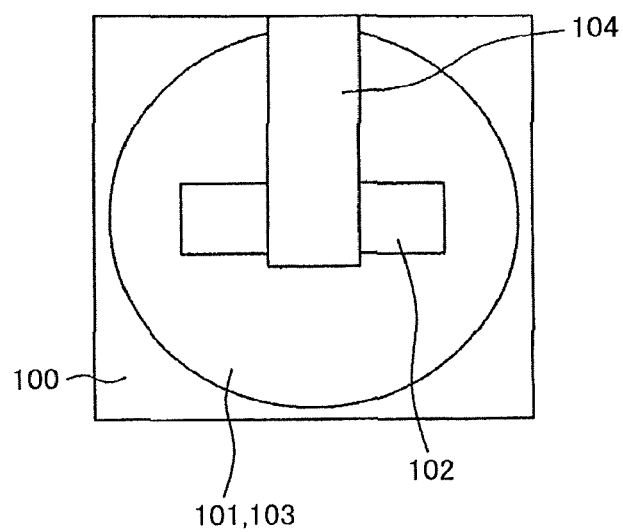
FIG. 3 is a plan view that shows the structure that the gate electrode has been formed.

FIG. 3 is a plan view of the structure explained in the above process. In FIG. 3, the undercoat 101 is first formed in circle shape; then the semiconductor layer 102 is formed on it. The gate insulating film 103 is formed in circle shape on the semiconductor layer 102. Then, the gate electrode 104 is formed on the gate insulating film 103.

Back to FIG. 1, the interlayer insulating film is formed on the gate electrode 104 and the gate insulating film 103. The interlayer insulating film 105 is formed only on the gate insulating film, not all over the substrate. Namely, the interlayer insulating film 105 is also made in circle shape, in a plan view, as the undercoat 101 or the gate insulating film 103. The reason is that the interlayer insulating film 105 is also formed by inorganic substance like SiN; thus, if it is formed all over the substrate, the interlayer insulating film 105 tends to be broken when the display is bent. The interlayer insulating film 105 is formed on all aver the substrate by CVD, first, then, patterned by photo lithography. In addition, in the present invention, the plan view of the interlayer insulating film 105 is made as circle, thus, the stress is uniform in all the bending directions.

Figure 4:
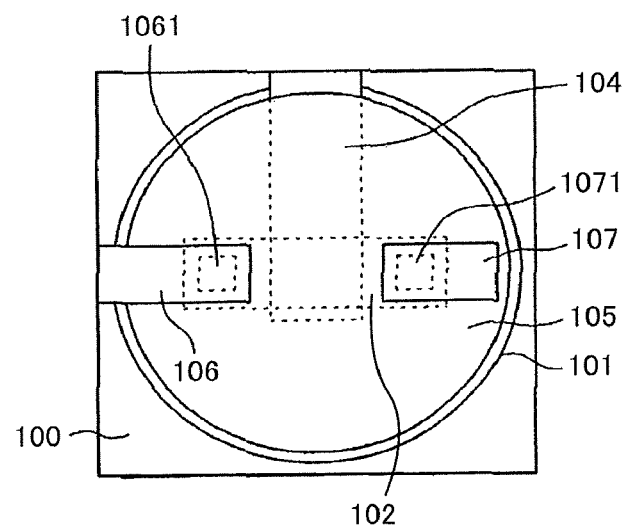
FIG. 4 is a plan view that shows the structure up to the structure that the drain electrode and the source electrode are formed.

After that, the through holes 1061, 1071 are formed in the interlayer insulating film 105 and the gate insulating film 103 for the drain electrode 106 and the source electrode 107. The drain electrode 106 and the source electrode 107 are formed by e.g. Mo, W, Ti or Al alloy. FIG. 4 is a plan view of this stage. In FIG. 4, the interlayer insulating film 105 is made circle shaped like the undercoat 101 and the gate insulating film 103. The drain electrode 106 contacts with the semiconductor layer 102 via through hole 1061 formed in the interlayer insulating film 105 and the gate insulating film 103; The source electrode 107 contacts with the semiconductor layer 102 via through hole 1071 formed in the interlayer insulating film 105 and the gate insulating film 103.

Back to FIG. 1, the organic passivation film 108 is formed covering the TFT. The organic passivation film 108 is made as thick as 2-3 μm since the organic passivation film 108 has also a role as a flattening film. The organic passivation film 108 is formed by resin, like acrylic. Using photo sensitive material for the organic passivation film 108, the through hole 1081 can be made without using a photo resist.

The lower electrode 109, which works as anode, is formed on the organic passivation film 108. The lower electrode 108 is a laminated film of the ITO (Indium Tin Oxide) film and the Ag film. The Ag film works as a reflection electrode. The ITO film formed under the Ag film has a role to strengthen the adhering between the organic passivation film 108 and the lower electrode 109. The ITO film formed on the Ag film works as anode. In the meantime, the metal film can be made by a metal other than Ag. The lower electrode 109 connects with the source electrode 107 of the TFT via the through hole 1081 formed in the organic passivation film 108.

The bank 110 is formed after the lower electrode 109 is formed. The bank 110 works to prevent a disconnection of the organic El layer. The bank 110 has also a role to isolate pixels from each other. The bank 110 is formed by resin of e.g. acrylic in thickness approximately 2 μm. The bank is formed as follows: a resin is coated on all over the substrate in about 2 μm thickness, then the resin is removed from the area where emitting substance is to be formed. The photo sensitive resin is preferable for the resin for the bank 110 because of easy manufacturing process.

Figure 5:
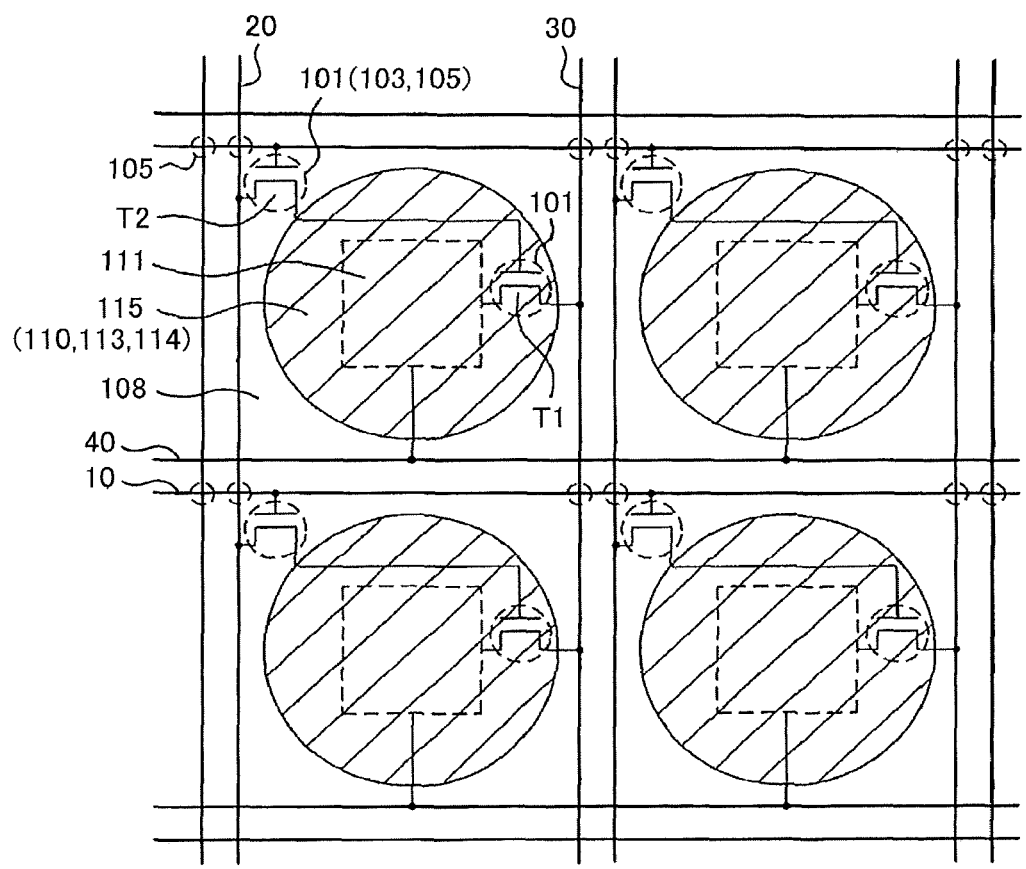
FIG. 5 is a plan view of the pixels according to the present invention.

The bank 110 is formed in circle shape, in a plan view, as the same as the protective film that is formed later. The above structure is shown in FIG. 5 as a plan view. FIG. 5 is a plan view of the pixel where the shaded circle area is a laminated portion of the bank 110, the first inorganic protective film 113, the organic protective film 114 and the second inorganic protective film 115. Namely, this circle shaped area is very thick compared to other portions; thus, this circled area is hard to be bent. Therefore, bending stress of the area where the bank 110 is formed is kept small. In the meantime, the rectangular region surrounded by a broken line is an arena where the 110 is eliminated and the organic EL layer is formed; thus, actual bank 110 is an area between the circle and the rectangular broken line.

Back to FIG. 1, in an area that is surrounded by the bank 110, the organic EL layer 111 is formed on the lower electrode 109. The organic EL layer comprising; e.g. the hole injection layer, the hole transport layer, the light emitting layer, the electron transport layer and the electron injection layer. Then the upper electrode 112 is formed on the organic EL layer. The upper layer constitutes a cathode and made by e.g. MgAg.

Conventionally, the upper electrode 112 was formed on all over the substrate; however, in the present invention, the upper electrode is formed only on the area that essentially covers the organic EL layer; consequently, cathode voltage is supplied by cathode wiring 40. Namely, an alloy like MgAg alloy is hard; in addition, they are formed thin to maintain transmittance of the light; thus, when the display device is bent, the conventional upper electrode 112 tends to be broken. The present invention avoids this problem by making the upper electrode 112 only on the area that essentially covers the organic EL layer 111; thus, the disconnection of the upper electrode can be avoided.

The upper electrode 112 is formed to cover the organic EL layer 111. The upper electrode 112 works as a cathode, thus, it must be supplied with a cathode voltage. In the present invention, since the upper electrode 112 is not formed in common in all the pixels but formed in individual pixels, the upper electrode 112 extends on the top of the bank 110, then connects with the cathode wiring 40 via the through hole 1101 formed in the bank 110; thus, the cathode voltage is supplied to the upper electrode 112. By the way, the thickness of the cathode wiring is 200 nm or more, which is thicker than the metal or the alloy of the upper electrode, thus, possibility of disconnection is very low even when the display is bent. The transparent oxide conductive film like e.g. AZO (Antimony Zinc Oxide) may be used as the upper electrode 112, however, the plan view of the pixel structure is the same as the case that MgAg is used as the upper electrode 112.

In FIG. 1, the protective film is formed on the upper electrode 112. The organic EL layer is degraded by moisture; thus, the protective film is formed to protect the organic EL layer 111. In FIG. 1, the protective film comprises: the first inorganic protective film 113, the organic protective film 114 and the second inorganic protective film 115. The first inorganic film 113, which is formed directly on the upper electrode 112, protects the organic EL layer 111 from the moisture. The first inorganic film 113 is formed by e.g. SiO or SiN in thickness about several hundred nanometers.

On the other hand, the organic protective film 114, which mechanically protects the organic EL layer 111, is formed as thick as 10-15 μm. A thickness of the organic protective film 114 is preferably two times or more thickness compared with the organic passivation film 108, and more preferably, three times or more than the thickness of the organic passivation film 108, and further preferably, thickness is 10 μm or more. As described above, the organic protective film 114 is made thick and in island shape; thus, the portion, where the organic EL display layer 111 exists, doesn't bend easily, consequently, the organic EL display layer 111 is not destroyed even the display device is bent. In addition, layers formed under the organic EL layer 111 like the inorganic insulating films and the oxide conductive film, or the inorganic protective films are not destroyed. The organic protective film 114 is formed by a transparent resin like acrylic.

The second inorganic protective film 115 is formed covering the organic protective film 114. The second inorganic protective film 115 covers the side surface of the organic protective film 114, thus, the organic protective film 114 is protected from intrusion of the moisture. The second inorganic protective film 115 is formed by SiN or SiO; the thickness of the inorganic protective film 115 is several hundred nanometers.

As shown by hatching area of FIG. 5, the plan view of the first inorganic protective film 113, the organic protective film 114, the second inorganic passivation film 115 are circle. The bank 110 is formed in the area where the protective films 113, 114, 115 are formed, thus, this area is much thicker compared with the other area, consequently, the area the protective films 113, 114, 115 are formed is hard to be bent even when the display is bent. That means the mechanical stress in the certain inorganic layers or in the organic EL layer can be kept low; thus, films or layers in this area are not broken.

In addition, since the area, where the protective layer is formed, is circle, in a plan view, the various inorganic films and the organic EL layer are protected from the mechanical stress in any bending directions.

Figure 2:
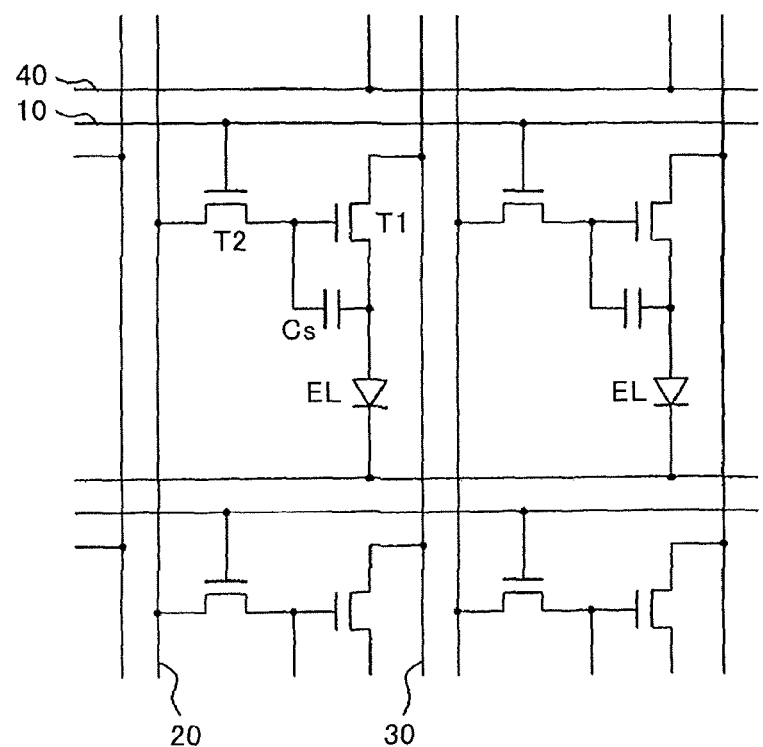
FIG. 2 is an equivalent circuit of the pixel.

FIG. 2 is an equivalent circuit of the pixel of the organic EL display device according to the present invention. In FIG. 2, the scanning lines 10 and the cathode lines 40 extend in lateral direction and arranged in longitudinal direction. The video signal lines 20 and anode lines 30 extend in longitudinal direction and arranged in lateral direction. The pixel is formed in an area surrounded by "the scanning liens and cathode lines" and "the video signal lines 20 and anode lines 30".

In general, organic EL display device doesn't need the cathode lines 40 since the cathode is formed on all over the display area; however, in the present invention, cathode lines 40 exist since the cathode voltage must be supplied to the cathode of the individual pixels. In FIG. 2, the cathode lines 40 extend in the same direction as the scanning lines 10 extend; however, the cathode lines 40 can extend in the direction the video signal lines 20 extend according to a necessity of the layout.

In the pixel, the organic EL element (EL), formed by the organic EL layer; and the driving TFT (T1) are serially connected. TFT in FIG. 1 is the driving TFT (T1). The storage capacitance Cs is formed between the gate and the drain of the driving TFT (T1). According to the voltage stored in the storage capacitance Cs, the current flows from the driving TFT (T1) to the organic EL element (EL).

In FIG. 2, a scanning line 10 connects to the gate of the selecting TFT (T2); according to ON or OFF signals of the scanning line 10, the gate of the selecting TFT becomes ON or OFF. When the selecting TFT (T2) becomes ON, video signals are supplied from the video signal line 20, and the storage capacitance Cs is charged with the video signals; the driving TFT (T2) is driven according to the stored voltage in the storage capacitance Cs; thus, the current flows in the organic EL layer (EL).

FIG. 5 is a plan view of the pixels according to the present invention. Though many pixels are formed in the display area in a matrix arrangement FIG. 5 depicts only four pixels. In FIG. 5, the scanning lines 10 and the cathode lines 40 extend in lateral direction while the video signal lines 20 and anode lines 30 extend in lateral direction. The pixel is formed in the area surrounded by the scanning lines 10 and the video signal lines 20; the organic EL layer and the TFT are formed in the pixel. The feature of the pixel of FIG. 5 is that the pixel is square.

In FIG. 5, the circle area, which is made hatching, is a thick area that is formed by the laminated layer of the bank 110, the first inorganic protective film 113, the organic protective film 114 and the second inorganic protective film 115. In the circle, the square area shown by the broken line is the area the organic EL layer 111 is formed, from which the light is emitted. The bank 110 doesn't exist in the square area surrounded by the broken line. The square area is covered by only the above explained protective films.

The area, which is represented by the second inorganic protective film 115, is circle, in a plan view. This area is hard to be bent in any directions; thus, the organic EL layer 111, the inorganic layers, etc. are mechanically protected. Namely, important elements of e.g. the organic EL layer 111, the driving TFT (T1) are located in this area, thus, those elements are protected from a bending stress.

In FIG. 5, the selecting TFT (T2) is formed in outside of the second inorganic protective film 115. The gate of the selecting TFT (T2) connects with the scanning line 10 while the drain of the selecting TFT (T2) connects with the video signal line 20. The source of the selecting TFT (T2) connects with the gate of the driving TFT (T2). The selecting TFT (T2) is formed on the undercoat 101, which is formed in circle shape in a plan view. The gate insulating film 103 and the interlayer insulating film 105 are also formed in circle shape as the same as the undercoat 101, which was explained in FIGS. 3 and 4. Therefore, even the selecting TFT (T2) is not mechanically protected by the protective films it is protected by the laminated layers of the undercoat 101, the gate insulating film 103 and the interlayer insulating film 105, which are made in circle shape in a plan view. Therefore, the selecting TFT (T2) is also endurable to the bending stress, and the elements constituting the selecting TFT (T2) are not easily broken.

By the way, the driving TFT (T1) is endurable to the bending stress since the driving TFT (T1) is mechanically protected by the second inorganic protective film 115, the organic protective film 114 and the first inorganic protective film 113 against the bending stress. In addition, the driving TFT (T1) also is formed in the area where the undercoat 101, the gate insulating film 103 and the interlayer insulating film 105 are formed in circled island shape; thus, the driving TFT (T2) is double protected against the bending stress.

As depicted in FIG. 5, the laminated area of the undercoat 101, the gate insulating film 103 and the interlayer insulating film 105, which are overlapped with the driving TFT (T1) and the laminated area of the undercoat 101, the gate insulating film 103 and the interlayer insulating film 105, which are overlapped with the selecting TFT (T2) can be separated to each other in a plan view.

In FIG. 5, the interlayer insulating film 105 is formed in island shape in the area where the scanning line 10 and the video signal line 20 cross each other. However, the area of this island shaped interlayer insulating film 105 is very small, thus, bending stress in this island shaped interlayer insulating film is small; thus, probability is small in that this interlayer insulating film is broken when the display is bent. The plan view of the interlayer insulating film 105, formed in island shape in the area where the scanning line 10 and the video signal line crosses, is circle.

Figure 6:
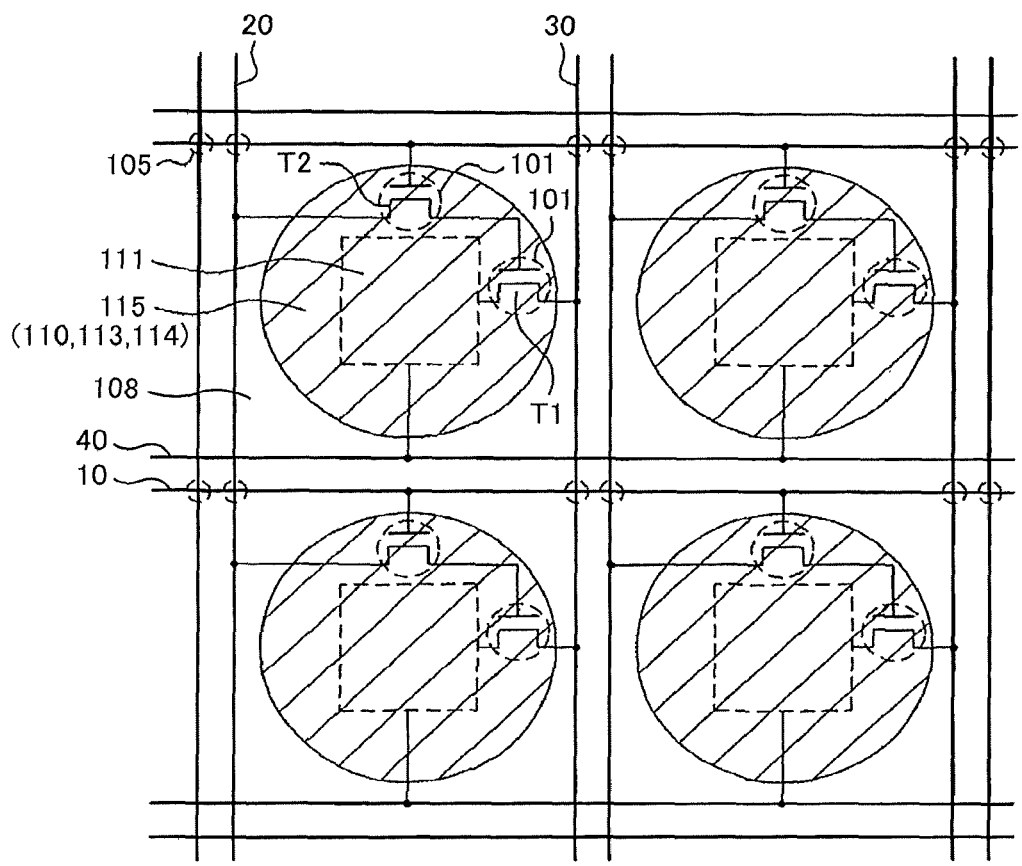
FIG. 6 is a plan view of another example of the pixels according to the present invention.

FIG. 6 is a plan view of another example of the present invention. FIG. 6 is different from FIG. 5 in that the selecting TFT (T2) is formed under the second inorganic protective film 115, the organic protective film 114 and the first inorganic protective film 113. Therefore, in FIG. 6, the selecting TFT (T2) is double protected against the bending stress as the case of the driving TFT (T1).

In FIGS. 5 and 6, the driving TFT (T1) is formed in the circle, which is made hatching, where the second inorganic protective film 115 and other protective films are formed. However, for the convenience of layout, the driving TFT (T1) may be set outside of the circle, which is made hatching. Even in this case, the driving TFT (T1) can be protected against the bending stress when the display is bent by setting the driving TFT (T1) in an area where the undercoat 101, the gate insulating film 103 and the interlayer insulating film 105 are laminated in circle island shape in a plan view. Thus, the driving TFT (T1) can avoid being broken by the bending stress.

Figure 7:
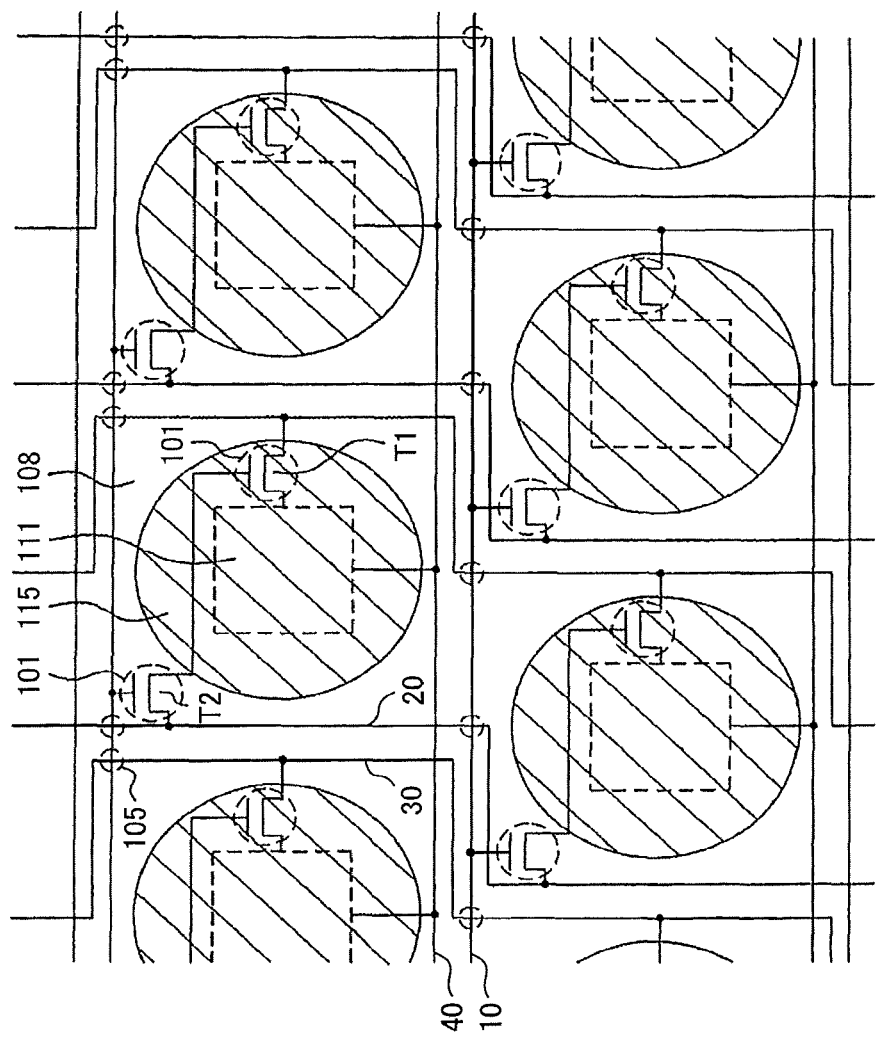
FIG. 7 is a plan view of yet another example of the pixels according to the present invention.

FIG. 7 is another example that the present invention is applied to another arrangement of the pixels. In FIG. 7, the pixels aligned in a first row and the pixels aligned in a second row are shifted by half length of the pixel. In FIG. 7, the circle area, where hatching is made, is a thick area where the second inorganic protective film 115, the organic protective film 114, etc. are laminated; thus, this area is hard to be bent. In FIG. 7, since pixels are shifted by half length of the pixel in lateral direction between the first row and the second row, the display device becomes easy to bend in longitudinal direction; however the display becomes hard to bend in lateral direction. Namely, there is no thick area along the scanning lines 10, thus, the display device becomes easy to bend in the direction perpendicular to the direction the scanning lines 10 extend.

On the contrary, the pixels aligned in a first column in longitudinal direction and the pixels aligned in a second column in longitudinal direction are shifted by half length of the pixel in longitudinal direction, the display device becomes easy to bend in lateral direction and becomes difficult to bend in longitudinal direction. As described above, the display can be designed to have an easy bending direction by applying the present invention in a specific pixel arrangement.

In any events, the important matter is that the area, which is protected by protective films whose shape is circle in a plan view, is protected from bending stress in any bending directions in the structure of FIGS. 5-7 or any other arrangement of the pixels. Thus, disconnection of wirings or destruction of the inorganic insulating films, the inorganic protective films or the oxide conductive films can be suppressed.

In FIGS. 5-7, the circle portion represented by the second inorganic protective film 105 in one pixel and the circle portion represented by the second inorganic protective film 105 in another pixel are separated by a distance of 2 μm or more, preferably 5 μm or more. If the distance is 2 μm or more, an interference between the circled protected areas can be avoided when the display device is bent; thus a bending stress caused by the thick area in adjacent pixel is avoided.

In the above explanation, the laminated area of the bank 110, the first inorganic protective film 113, the organic protective film 114, the second inorganic protective film 115 are circle in a plan view; however, sometimes it happened to be difficult to make them in circle shape because of e.g. layout requirement. In this case, the laminated area can be polygon like octagon, heptagon, hexagon, pentagon, etc. The polygon has preferably at least five sides. The purpose is to make the bending stress as uniform as possible in any bending directions.

Figure 8:
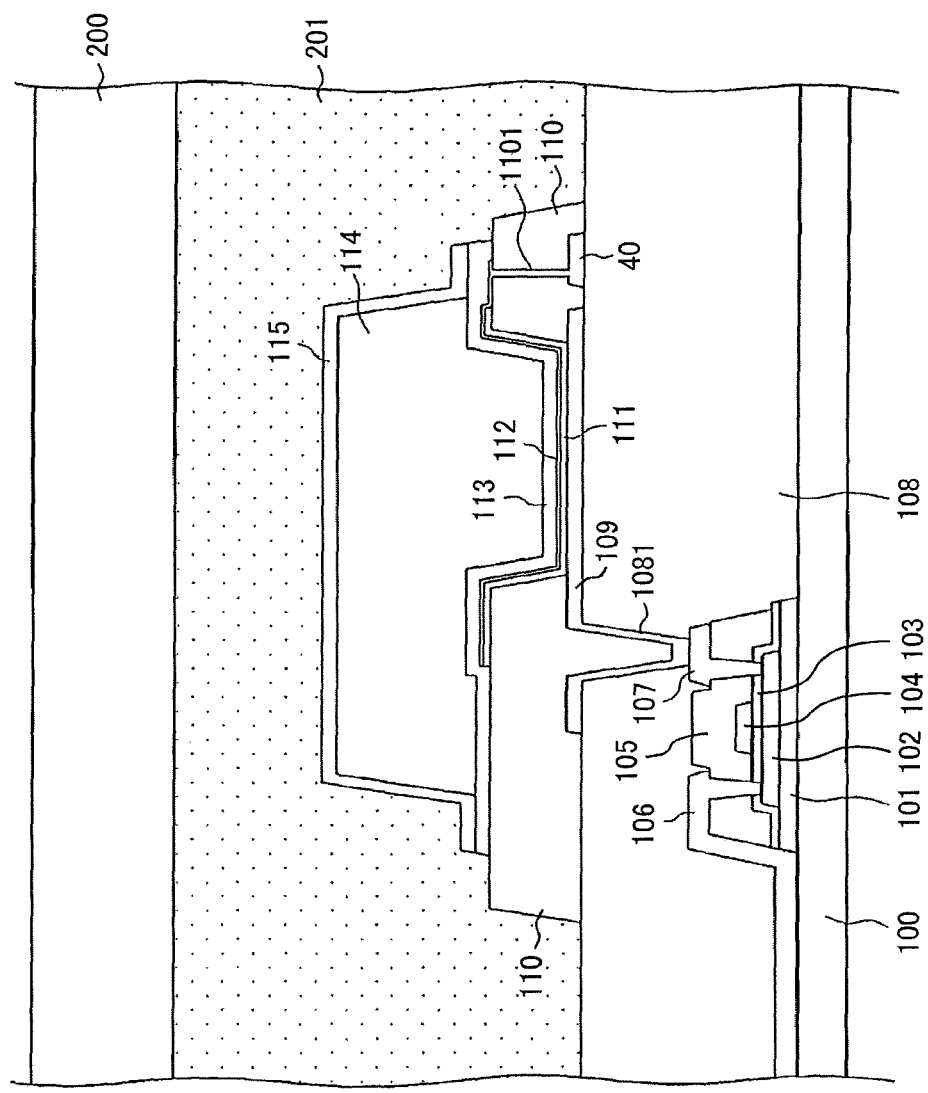
FIG. 8 is a cross sectional view that the polarizing plate is adhered to the organic EL display device.

As described in FIG. 1, the area, where the bank 110, the first inorganic protective film 113, the organic protective film 114 and the second inorganic protective film 115 are formed, is thicker compared with the other area; thus, the surface of the organic EL display device becomes uneven. On the other hand, a polarizing plate is used in the organic EL display device to avoid reflection of external light. FIG. 8 is a cross sectional view that shows this structure. The polarizing plate 200 is adhered to the organic EL display device with the adhesive 201.

The adhesive 201 is 20-30 μm thick, thus, the adhesive 201 can fill the dent portion of the surface, consequently, the surface of the polarizing plate 200 becomes flat. The thickness of the polarizing plate is about 100 μm, and the basic material is resin; thus, the polarizing plate doesn't hinder for bending the organic EL display device.

In the above examples, the thick laminated area of the bank 110, the first inorganic protective film 113, the organic protective film 114, the second inorganic protective film 115, etc. is formed in each of the pixels. The term of "pixel" can be substituted as "sub pixel" or "dot". However, when the screen becomes high definition, it becomes difficult to form such protective films in each of the pixel. In this case, the thick protective films of the bank 110, the first inorganic protective film 113, the organic protective film 114, the second inorganic protective film 115, etc. can be formed in common in several pixels.

Figure 9:
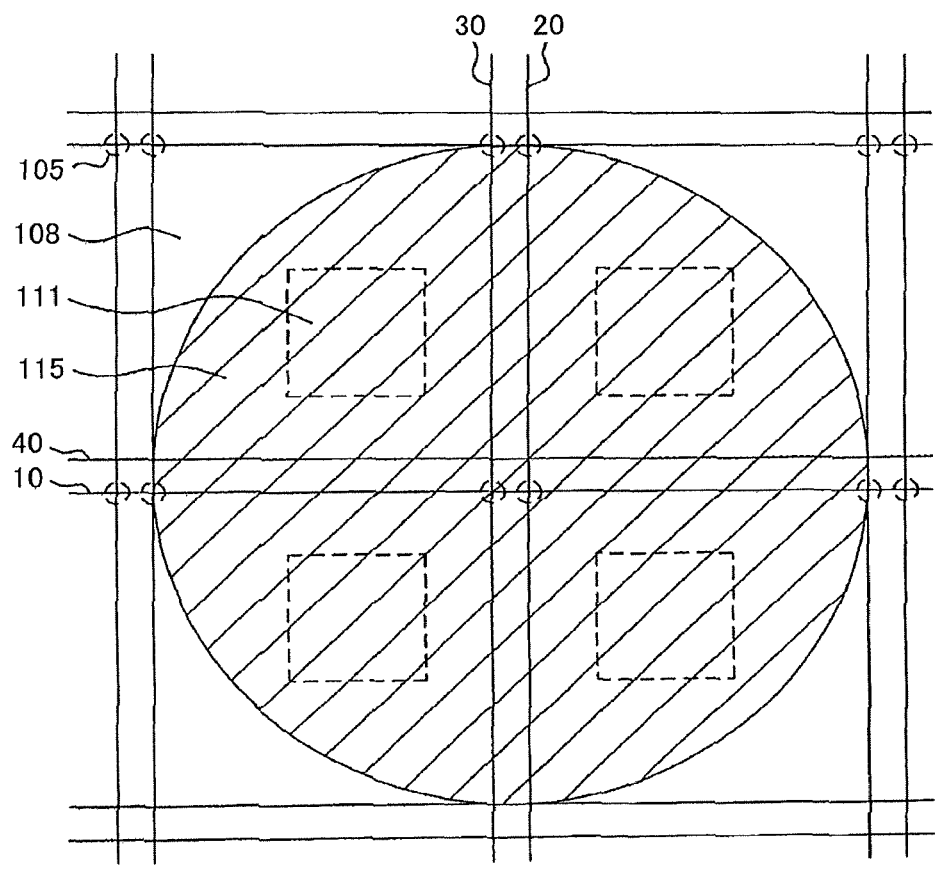
FIG. 9 is a plan view of yet another example of the pixels according to the present invention.

FIG. 9 is an example where the laminated layer, which is circle in a plan view, formed by the bank 110, the first inorganic protective film 113, the organic protective film 114, the second inorganic protective film 115, etc. covers four pixels in common. The pixels are square and the protectives layers are circle, thus, the organic EL layer 111 is shifted from the center of the pixel so that the four organic EL layers are protected effectively by one laminated area of the protective films. The upper electrode can be formed in common for the four pixels; then the upper electrode for the four pixels can be separated from the other upper electrodes for the other four pixels. The driving TFT (T1) and the selecting TFT (T1) are omitted in FIG. 9.

FIG. 9 shows only four pixels, and the set of four pixels is repeatedly arranged to form the display area. The common protective layer represented by the second inorganic protective film 115 for four pixels is circle (the common protective layer may be conveniently labeled as 115 in the specification), the circled protective layer is arranged repeatedly in the display area. A certain distance is necessary between the common protective layer 115 and the adjacent common protective layer 115. If the distance is 2 μm or more, an interference between the circled protected areas can be avoided when the display device is bent; thus a bending stress caused by the thick area in adjacent pixel can be avoided.

FIG. 9 shows that one island shaped protective layer is formed for four pixels in common. If the pixels are arranged like FIG. 7 as that the pixels aligned in a first row and the pixels aligned in a second row are shifted by half length of the pixel, three pixels are covered by a common protective layer, which is circle island shape. By setting three pixels to be covered by the by the common protective layer 115, a red pixel, a green pixel and a blue pixel can be set in common, thus, white uniformity can be easily attainable.

As described above, the laminated protective layer, which is made circle in a plan view, can be formed in common for plural pixels. The area is protected from moisture and protected from bending stress as well.

The above explanation was made under the condition that the TFT is a top gate type, however, the present invention is applicable when the TFT is a bottom gate type. Even in a bottom gate type, the gate insulating film is indispensable, and generally, the undercoat and the interlayer insulating film are necessary. Thus, the present invention can be applied to the structure that the TFT is the bottom gate type and can perform the same effects as in the top gate type TFT as explained above.

What is claimed is:

1. An organic EL (ELECTROLUMINESCENCE) display device comprising:
   pixels, wherein
   each of the pixels has an emitting layer, which is sandwiched by a lower electrode and an upper electrode,
   a first inorganic protective film is formed covering the emitting layer,
   the first inorganic protective film is a circle or a polygon having at least five sides, in a plan view,
   each of the pixels has a first TFT (Thin Film Transistor) connecting with the lower electrode and a second TFT connecting with the first TFT,
   the first TFT is covered by the first inorganic protective film, and
   the second TFT is not covered by the first inorganic protective film.

2. The organic EL display device according to claim 1, wherein
an organic protective film is laminated on the first inorganic protective film,
the organic protective film is a circle or a polygon having at least five sides, in the plan view.

3. The organic EL display device according to claim 2, wherein a thickness of the organic protective film is 10 μm or more.

4. The organic EL display device according to claim 2, wherein
a second inorganic protective film is laminated on the organic protective film, and
the second inorganic protective film is a circle or a polygon having at least five sides, in the plan view.

5. The organic EL display device according to claim 4, wherein
the pixels include a first pixel and a second pixel,
each of the first pixel and the second pixel include a respective first inorganic protective film,
one of the first inorganic protective films is formed in the first pixel,
another of the first inorganic protective films is formed in the second pixel,
the one of the first inorganic protective films and the another of the first inorganic protective films are adjacently located, and
a distance between the one of the first inorganic protective films and the another of the first inorganic protective films is 2 μm or more.

6. The organic EL display device according to claim 1, wherein
the first inorganic protective film is formed in the pixels in common,
the first inorganic protective film is formed on the emitting layers in the pixels, and
each of the emitting layers is sandwiched by the lower electrode and the upper electrode.

7. The organic EL display device according to claim 1, wherein
the upper electrode is formed in the pixels in common, and
the upper electrode is separated from another upper electrode that is formed in common for other plural pixels.

8. The organic EL display device according to claim 1, wherein the first inorganic protective film is a circle in the plan view.

9. An organic EL (ELECTROLUMINESCENCE) display device comprising:
pixels, wherein
each of the pixels has an emitting layer, which is sandwiched by a lower electrode and an upper electrode, and a first TFT (Thin Film Transistor), which connects with the lower electrode,
the first TFT includes a first semiconductor layer, which is formed on an first undercoat formed on a substrate, a first gate insulating film, and a first gate electrode,
the first undercoat is formed in an island shape at a position corresponding to the first TFT,
the first undercoat is a circle or a polygon having at least five sides, in a plan view,
the first gate insulating film, which is formed on the first undercoat, is formed in an island shape, and
the first gate insulating film is a circle or a polygon having at least five sides, in the plan view.

10. The organic EL display device according to claim 9, wherein
the first gate electrode, the first gate insulating film, and the first semiconductor layer are covered by a first inorganic interlayer insulating film, and
the first inorganic interlayer insulating film is a circle or a polygon having at least five sides, in the plan view.

11. The organic EL display device according to claim 10, wherein the first inorganic interlayer insulating film is a circle, in the plan view.

12. The organic EL display device according to claim 9, wherein the first undercoat and the first gate insulating film are circles, in the plan view.

13. The display device according to claim 9, wherein
each of the pixels has a second TFT that connects with the first TFT,
the second TFT includes a second semiconductor layer, which is formed on a second undercoat formed on the substrate, a second gate insulating film, and a second gate electrode,
the second undercoat is formed in an island shape at a position corresponding to the second TFT,
the second undercoat is a circle or a polygon having at least five sides, in the plan view,
the second gate insulating film, which is formed on the second undercoat, is formed in an island shape, and
the second gate insulating film is a circle or a polygon having at least five sides, in the plan view.

14. The organic EL display device according to claim 13, wherein
the second gate electrode, the second gate insulating film, and the second semiconductor layer are covered by a second inorganic interlayer insulating film, and
the second inorganic interlayer insulating film is a circle or a polygon having at least five sides, in the plan view.

15. The organic EL display device according to claim 14, wherein the second inorganic interlayer insulating film is a circle, in the plan view.

16. The organic EL display device according to claim 13, wherein the second undercoat and the second gate insulating film are circles, in the plan view.

* * * * *